United States Patent [19]
Brooks et al.

[11] Patent Number: 5,815,050
[45] Date of Patent: *Sep. 29, 1998

[54] DIFFERENTIAL DELAY LINE

[75] Inventors: Mark Brooks, North Mankato; Mark Hamilton Broman, Mankato; Michael Howieson, Good Thunder, all of Minn.

[73] Assignee: Thin Film Technology Corp., North Mankato, Minn.

[*] Notice: This patent issued on a continued prosecution application filed under 37 CFR 1.53(d), and is subject to the twenty year patent term provisions of 35 U.S.C. 154(a)(2).

[21] Appl. No.: 773,434

[22] Filed: Dec. 27, 1996

[51] Int. Cl.⁶ ................................ H01P 1/18; H01P 9/00
[52] U.S. Cl. ............................. 333/161; 333/156
[58] Field of Search ................. 333/1, 4, 5, 156, 333/161, 138, 140, 246

[56] References Cited

U.S. PATENT DOCUMENTS

| | | | |
|---|---|---|---|
| 3,440,573 | 4/1969 | Butler | 333/156 X |
| 3,581,250 | 5/1971 | Eichert | 333/161 |
| 3,670,270 | 6/1972 | Storey, II | 333/161 |
| 4,463,323 | 7/1984 | Piper | 333/1 |
| 4,513,266 | 4/1985 | Ishihara | 333/246 X |
| 5,073,755 | 12/1991 | Neufeld | 333/161 X |
| 5,146,191 | 9/1992 | Mandai et al. | 333/161 |
| 5,365,203 | 11/1994 | Nakamura et al. | 333/161 |

FOREIGN PATENT DOCUMENTS 1170587  7/1985  U.S.S.R. ................. 333/156

*Primary Examiner*—Robert J. Pascal
*Assistant Examiner*—Seungsook Ham
*Attorney, Agent, or Firm*—D. L. Tschida

[57] ABSTRACT

A thin film differential delay line configured in a strip line assembly on ceramic substrates for PECL logic applications. A number of alternative layered constructions are disclosed. Each assembly provides complementary serpentine conductors constructed in symmetrical arrangements, i.e. side-by-side, over-under and mirrored. Bordering ground conductors at the signal layer and adjacent ground planes layers shield the delay line conductors. Termination pads having plated through vias facilitate electrical couplings between the layers.

14 Claims, 11 Drawing Sheets

DIFFERENTIAL DELAY LINE

BACKGROUND OF THE INVENTION

The present invention relates to delay lines and, in particular, to differential, thin film, transmission line delay lines for use in PECL logic circuitry.

Transmission line assemblies having predetermined, equally distributed signal delay characteristics are known which are constructed on a variety of substrate materials using a variety of processing techniques. Delay line devices of this type are frequently used to adjust timing inconsistencies of complex circuits.

Such devices are typically constructed with serpentine conductor paths. The time delay characteristic of any device is principally determined by the impedance and the physical length of the signal path. As a general rule, the thinner the line width, the more lines that can be deposited, and therefore the greater the possible length of the signal path and time delay. A circuit designer, in turn has greater design flexibility. The signal lines may be spread over a single layer or a number of stacked and interconnected layers.

Conductor spacings must also be adequate to prevent undesired electrical cross coupling which can result in reflections and signal degradation. Negative inductive coupling, in particular, can occur if the paths are spaced too closely together. Other device characteristics of concern are the numbers and relative positioning of adjacent ground planes and the dielectric properties of all materials separating the transmission line and ground layers, which also affect the distributed inductance and capacitance of the resulting device. Where delay lines are used in high frequency applications, a ceramic substrate material, such as aluminum oxide, is preferred. The material, however, presents size limitations due to handling difficulties in the "green state" of the material.

When used in positive emitter coupled logic (PECL) applications, additional concerns arise in regard to cross talk and signal skewing that can occur between the complementary signals transmitted over differential conductive paths. Various transmission line, delay line devices of which Applicant is aware can be found at U.S. Pat. Nos. 5,365,203; 5,164,692; 5,146,191; 5,030,931; 4,641,114; 4,641,113; 3,257,629 and 2,832,935. While some of the foregoing devices incorporate features of construction similar to the subject assemblies, none provides a construction that includes the common mode rejection advantages of the present invention.

The invention provides a number of alternative delay line circuits which are compatible with PECL circuitry. The circuits can be stacked in multiple levels to achieve greater delays.

In one assembly, conductive signal paths are deposited on the substrate in displaced, parallel registry. In another assembly, identical signal paths are deposited on top and bottom surfaces of each substrate. In yet another assembly, mirrored signal paths are provided on adjoining halves of a substrate surface.

Contacts connected with through vias are provided at facing surfaces of adjoining layers. Grounding contacts are provided in regions adjoining the periphery of the conductive signal paths and signal contacts are provided at the ends of the signal paths. The layers are electrically coupled upon aligning the grounding and signal contacts at the various layers.

SUMMARY OF THE INVENTION

It is a primary object of the present invention to provide a transmission line delay line compatible with PECL logic applications and with symmetrical signal paths that are configured to electrically interact with one another.

It is a further object of the invention to provide assemblies constructed on a number of layered ceramic substrates and wherein the signal paths exhibit optimal common mode rejection, minimal cross talk and optimal density of the conductor lines for the available fabrication space at the substrate.

It is a further object of the invention to provide an assembly including complementary, symmetrical serpentine conductive signal paths which are bordered by conductive ground strips or contacts that mate with ground strips or contacts at over and under lying ground planes.

It is a further object of the invention to provide another construction having identical conductive signal paths deposited at upper and lower surfaces of a substrate and wherein bordering ground paths couple to mating ground paths and an adjoining ground plane.

It is a further object of the invention to provide another assembly, although exhibiting less desirable line coupling, having identical mirrored conductive signal paths deposited at adjoining sides of a substrate surface and separated by intervening ground conductors and wherein bordering ground paths couple to bordering ground paths and an adjoining ground plane.

It is a further object of the invention to provide assemblies which can be stacked in levels with a number of other comparable delay line levels.

Various of the foregoing objects, advantages and distinctions of the invention can be found in one presently preferred circuit construction which provides a signal layer having sputtered, serpentine signal conductors deposited in parallel registry over a ceramic substrate. A hard epoxy resin dielectric is applied over the signal conductors. Bordering, coplanar conductive ground strips mate with ground strips and general ground planes at facing ground layers. Aligned contacts having through vias couple the ground strips, ground planes and signal layers to one another. Edge terminations are provided at a termination layer of the assembly to accommodate a surface mount package.

In an alternative construction, identical serpentine signal paths are deposited to opposite surfaces of a signal layer with bordering, coplanar ground strips. A hard epoxy dielectric resin is applied over the signal paths. Ground strips provided at ground plane layers facing each signal layer couple to the signal layer ground strips and to a general ground plane plated to the opposite side of each ground layer.

In still another alternative construction, identical mirrored serpentine signal paths are deposited at adjoining sides of one surface of a signal layer with intervening and bordering, coplanar ground conductors. A hard epoxy dielectric resin is applied over the signal paths. A ground layer is stacked above and below the signal layer. Complementary ground strips are provided at the opposed ground layers and a general ground plane is plated to one side of each ground layer.

Still other objects, advantages and distinctions of the invention will become more apparent from the following description with respect to the appended drawings. To the extent alternative constructions, improvements or modifications have been considered, they are described as appropriate. The description should not be literally construed in limitation of the invention. Rather, the scope of the invention should be broadly interpreted within the scope of the further appended claims.

BRIEF DESCRIPTION OF THE DRAWINGS

Like reference numerals refer to like structure at the various drawings and which are as follows.

DESCRIPTION OF THE PREFERRED EMBODIMENT

Figure 1:
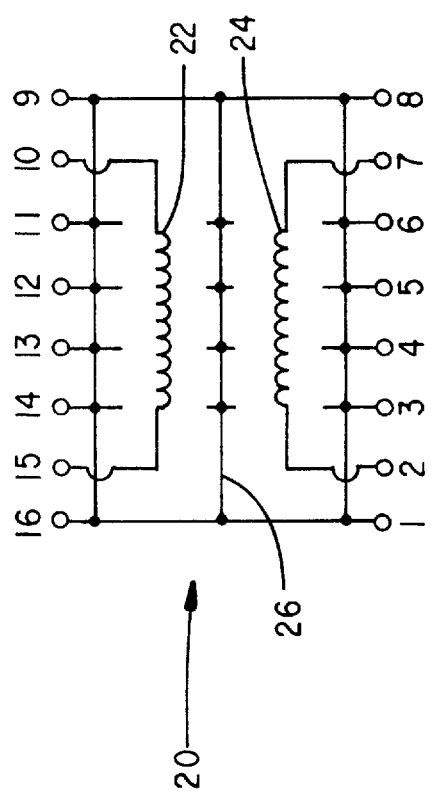
FIG. 1 a circuit diagram to an exemplary delay line construction of the invention.

Referring to FIG. 1 a circuit diagram is shown to a representative multi-level surface mount delay line 20 constructed in accordance with the invention. Replicated levels, such as shown in the alternative assemblies of FIGS. 2, 3; 4–6; and 7–9, are coupled together as necessary to obtain a desired time delay. The levels are coupled to one another at internal plated through vias which terminate at appropriately positioned edge mounted terminals 1–16. The number of levels at each device 20 are typically arranged to provide a delay on the order of 0.1 to 4.5 nanoseconds. The delay lines 20 find useful application in the assembly of high frequency, digital switching assemblies.

Each delay line 20 provides a pair of complementary conductors 22 and 24 which are formed in the shape of serpentine paths. The conductors 22 and 24 extend between input terminals 2 and 15 and output terminals 7 and 10. The remaining terminals 1, 3–6, 8, 9, 11–14 and 16 are coupled to a reference ground conductor 26 that is configured as a pair of over and under lying ground planes. Depending upon the packaging of the device 2, the configuration and location of the conductors 22 and 24 and terminals 1–16 can be appropriately varied, presently a surface mount, edge terminated package configuration is preferred.

The conductors 22 and 24 present a uniform 50 ohm impedance over their lengths, although can be formed to exhibit any desired impedance. The shape of the conductors 22 and 24 may also be varied to provide any variety of convoluted, wavy or serpentine patterns. The layers of each assembly at each level are laminated together and a preferred number of levels can be stacked and electrically connected to provide a desired delay. A number of different delays might be obtained at a particular assembly with the inclusion of appropriate intermediate terminations and the signal path conductors of the different levels.

Various of the ground terminals are connected to conductive ground strips at the signal layers and at adjoining ground layers which circumscribe the conductors 22 and 24. Separate ground planes are provided at the ground layers to encapsulate each signal layer at each level.

Figure 2:
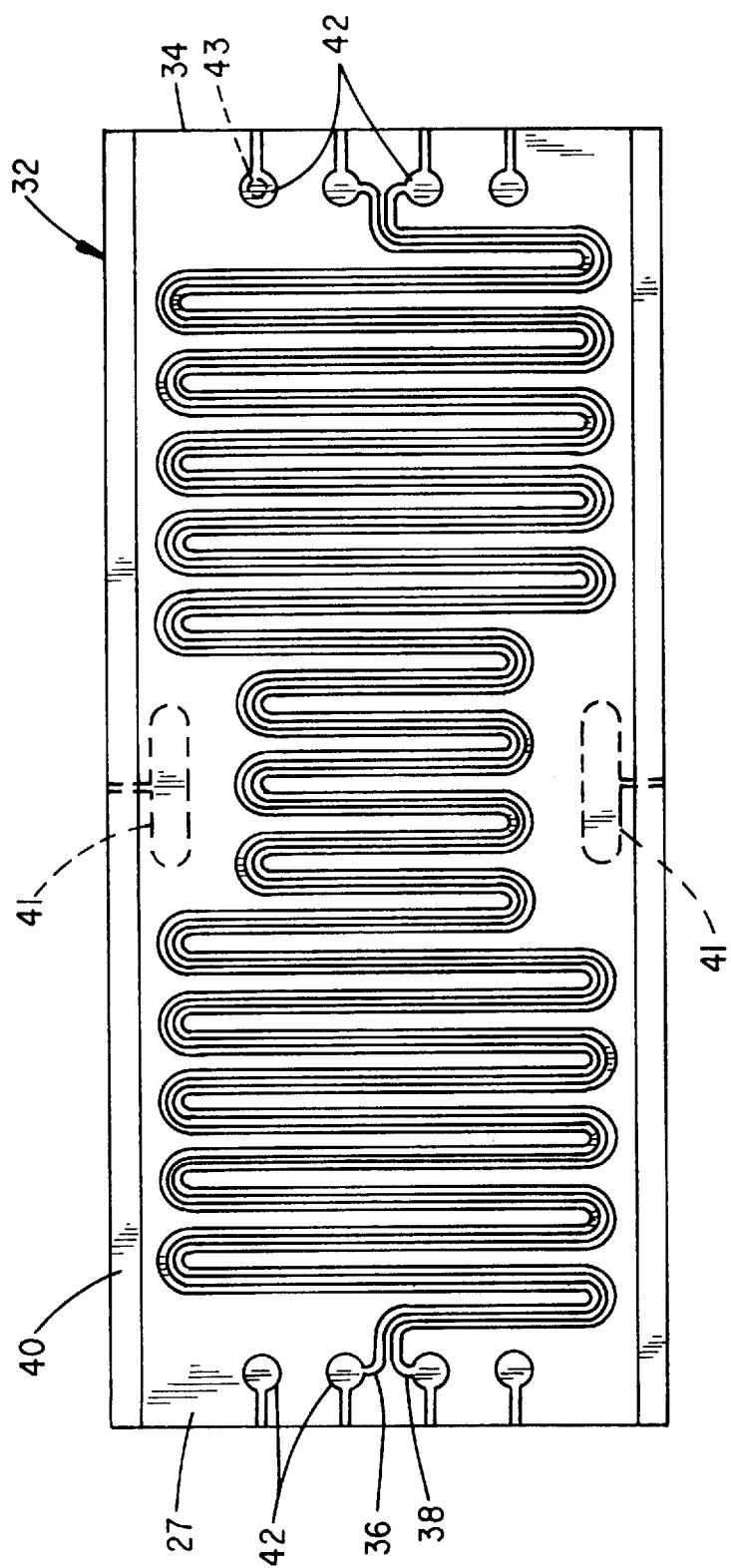
FIG. 2 is a top plan view of a signal layer containing displaced, parallel signal paths and bordering ground strips or contacts of one delay line assembly.
Figure 3:
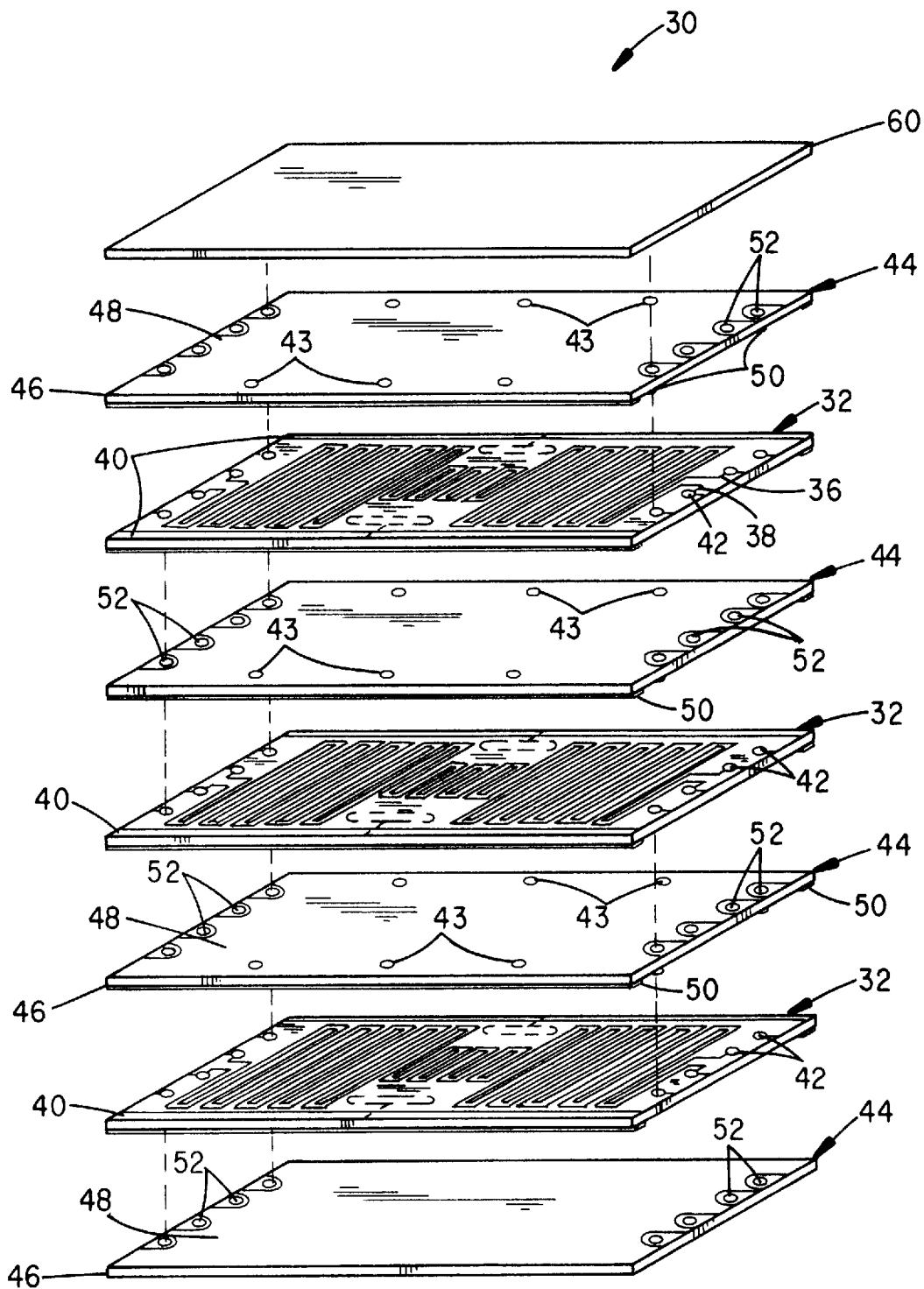
FIG. 3 is a perspective drawing shown in exploded assembly to a multi-level delay line assembly including three parallel signal path layers of FIG. 2.

Referring to FIGS. 2 and 3, a presently preferred parallel path construction of a transmission line delay line assembly 30 is shown. One of a number of signal layers 32 is shown in detail at FIG. 2 and an exploded assembly of a number of signal layers 32 and ground layers 44 are shown at FIG. 3.

With attention to FIG. 2, the signal path layer 32 of the device 30 is formed over a ceramic substrate 34. The substrate 34 exhibits a nominal thickness on the order of 0.25 mm and a dielectric constant of 9.6. Sputtered onto the substrate 34 are a pair of parallel, serpentine conductors 36 and 38. The conductors 36 and 38 are constructed to a width of 80 microns and are separated from one another by a spacing of 80 microns. A serpentine configuration is provided, although any variety of winding or wavy path configurations might be used.

Ground strips 40 or ground contacts 41 (shown in dashed line) border the conductors 36 and 38. FIG. 3 also depicts both the ground strips 40 and contacts 41, although normally only one or the other is used. The strips 40 and contacts 41 are formed to the same thickness as the conductors 36 and 38. Depending upon the signal path design, either the full length ground strips 40 or the reduced size ground contacts 41 can be used with varying advantage. When ground contacts 41 are used, the width of the conductor paths 36, 38 is reduced to define a pinched region along a portion of the conductor lengths.

A number of signal path termination pads 42 are provided at the ends of each signal layer 32. The number and location of the termination pads 42 is adjusted in relation to the number of levels at the assembly 30. The positioning of the termination pads 42 is established to provide a desired coupling between the conductive paths 36 and 38 from one level to the next of the assembly 30. The termination pads 42 are aligned to appropriately couple with isolated termination pads 52 formed on opposite sides at the adjoining ground layers 44 and thereby to other termination pads 42 at each succeeding level. Presently, a serial coupling of the signal path conductors 36 and 38 of each level is desired.

Through vias 43 are formed in each termination pad 42. The holes of the vias 43 are laser formed and back filled with solder to couple with termination pads 42 on the opposite side of the substrate 34.

Although FIG. 3 depicts a three level, multi-layer assembly 30, more or less levels can be provided as desired. Each level includes a signal layer 32 and upper and lower, adjoining ground layers 44. Each ground layer 44 is constructed on a ceramic substrate 46 having a ground plane conductor 48 plated to substantially cover one surface. A number of patterned ground strips 50 are provided at an opposite surface and connected to the ground plane 48 with appropriately positioned through vias 43. The ground layers 44 are stacked against the opposite surfaces of the signal layer 32 with the ground strips 40 and 50 contacting one another.

The termination pads 52 are provided at the left and right ends of the ground plane 48 and align to selected ones of the termination pads 42 at the input and output ends of the signal conductors 36 and 38. The pads 52 are electrically connected to pads 52 at the opposite surface of the layer 44 with through vias 43. Upon alternately stacking the signal and ground layers 32 and 44, the conductors 36 and 38 of each signal layer 32 are serially connected and the ground strips 40, 50 and ground planes 48 are connected to shield each signal layer 32.

A termination layer 60 is appropriately patterned to include the termination pads 1–16, which pads are not shown for convenience. The pads 1–16 mate to the terminations 40, 42 and 52 of the lower layers. The pads 1, 3–6, 8, 9, 11–14 and 16 are coupled together and connect to an electrical reference ground and the pads 2, 7, 10 and 15 couple to the ends of the differential signal path conductors 36 and 38 and the PECL input signals.

A hard coat, dielectric epoxy resin 27 is deposited to a thickness in the range of 15 to 25 microns over the conductors 36, 38 and 40. The ground strips 40 remain uncoated. The resin is applied after appropriately layering a number of signal and ground layers 32 and 44, with the ground strips 40, ground planes and contacts 42 and 52 contacting one another, when the resin 27 is applied in a vacuum to fill any interstices. The mating metallic contact surfaces are separately heated to solder to one another.

Figure 4:
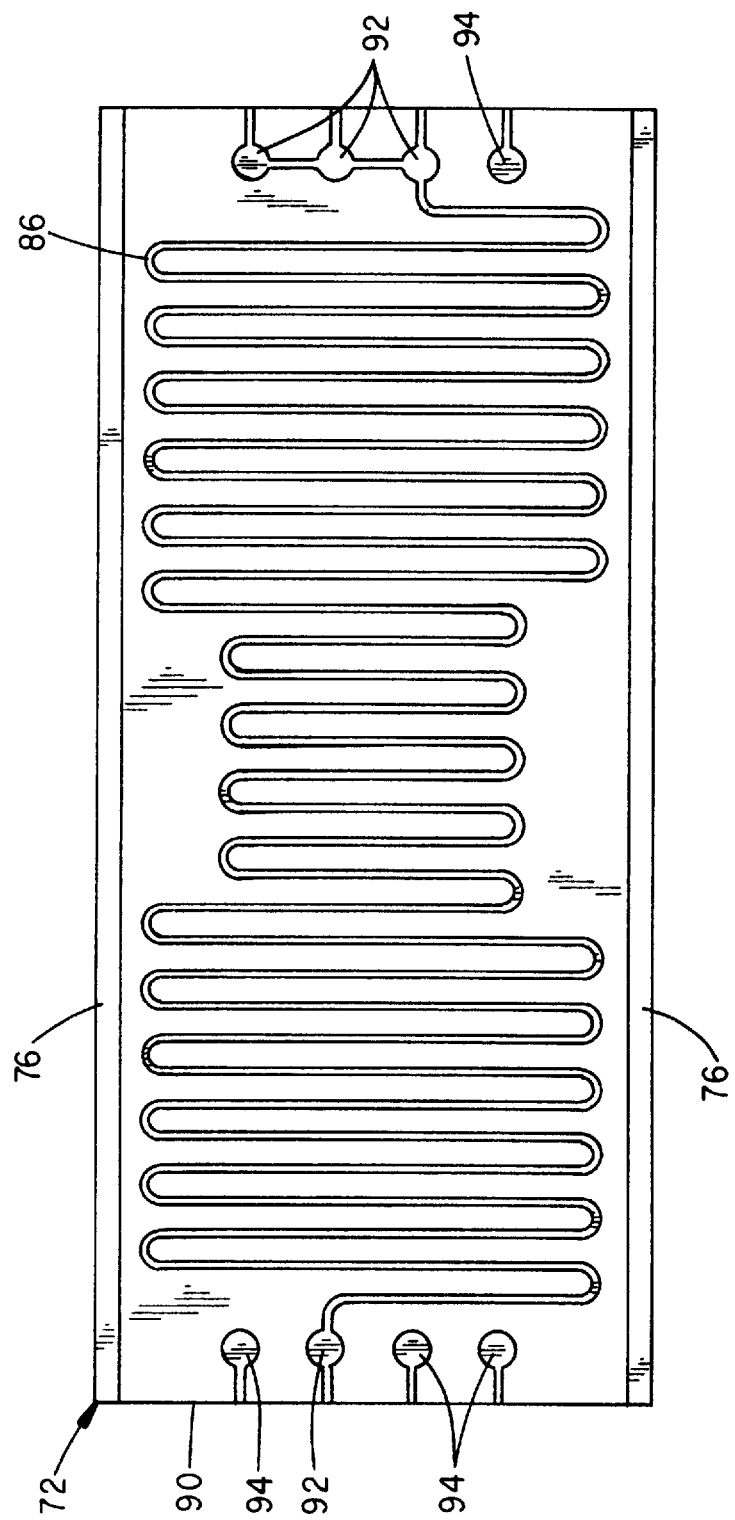
FIG. 4 is a top plan view showing the signal path and bordering ground conductors of one of two signal layers of an over-under delay line assembly.
Figure 5:
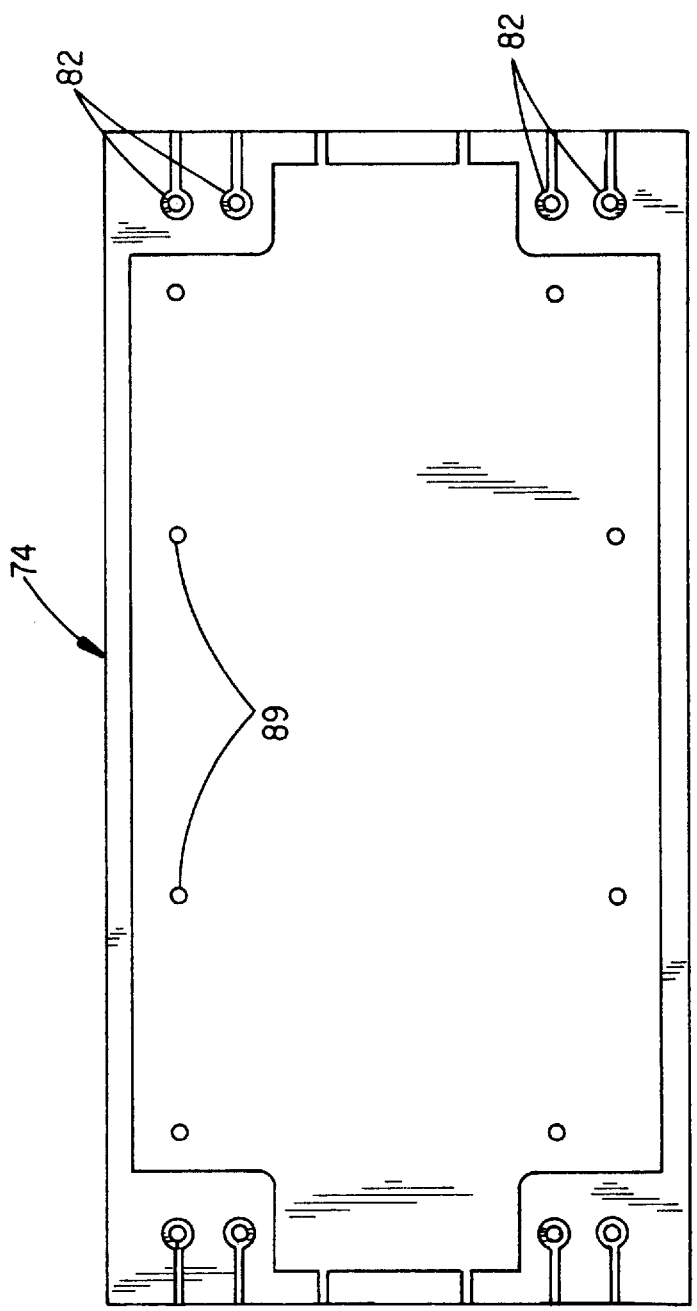
FIG. 5 is a top plan view of the ground layer which is used with the over under signal layers of FIG. 4.
Figure 6:
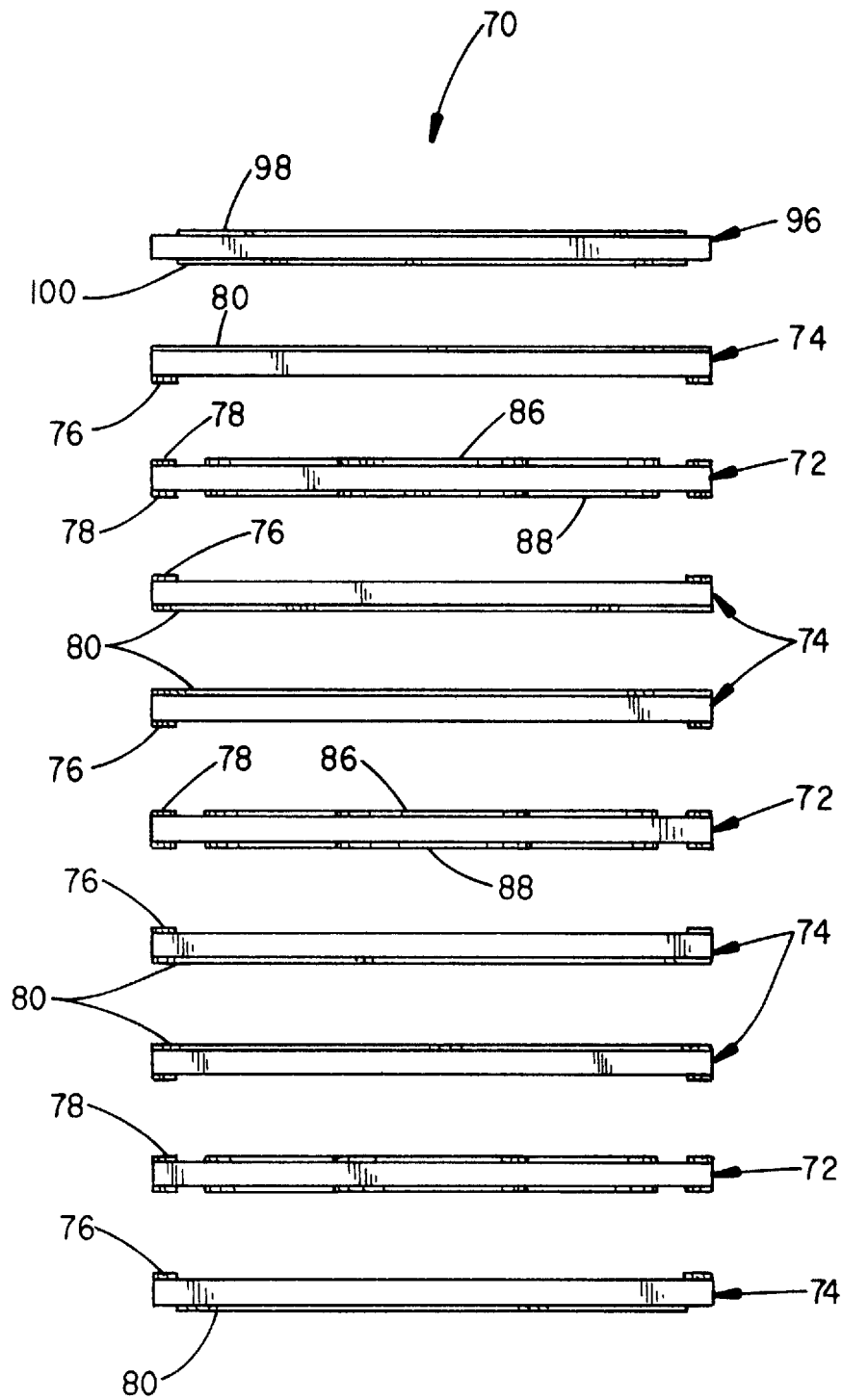
FIG. 6 is an exploded assembly drawing shown in edge profile to three exemplary levels of a multi-level, over-under delay line assembly.

FIGS. 4 through 6 depict an alternative construction of a delay line 70 which provides a circuit similar to the delay line 2. Three levels of the delay line 70 are shown in edge profile at FIG. 6. The assembly 70 includes a number of signal layers 72, reference FIG. 4, which are stacked between intervening pairs of ground layers 74, reference FIG. 5.

With reference to FIGS. 6 and 5, a ground layer 74 is mounted to either side of each signal layer 72 with ground strips 76 contacting mating ground strips 78 at the signal layer 72. The ground strips 76 are deposited to thicknesses which physically separate the substrate of each ground layer 74 from the adjoining signal path 86, 88. The ground strips 76 are sized to overlap and electrically couple to a ground plane 80 at each ground layer 74. Each level is defined with the back to back mounting of the ground planes 80 of two adjacent ground layers 74 to one another.

The alignment of isolated termination pads 82 in each ground layer 74 with termination pads 92 and 94 in the signal layers 72 electrically connects the upper and lower signal paths 86 and 88 at the signal layers 72 to one another. Through vias 89 connect the ground strips 76 to the ground plane 80.

With attention to FIG. 4 and in distinction to the parallel conductors 36 and 38, each signal layer 72 provides a pair of identical serpentine conductors 86 and 88, only one of which is shown, which are formed to overly one another at the top and bottom surfaces of a ceramic substrate 90. The conductors 86 and 88 extend between termination pads 92 and 94 at the ends of the layer 72. The pads 92 and 94 are patterned and arranged to align with the pads 82 at the ground layers 74 of each level, such that the paths 86 and 88 are serially connected at the three different levels.

A termination layer 96, reference FIG. 6, includes a conductive surface 98 that is appropriately patterned to provide appropriate device terminations 1–16. A ground plane 100 at the bottom surface contacts the ground plane 80 of a lower lying ground layer 74.

Figure 7:
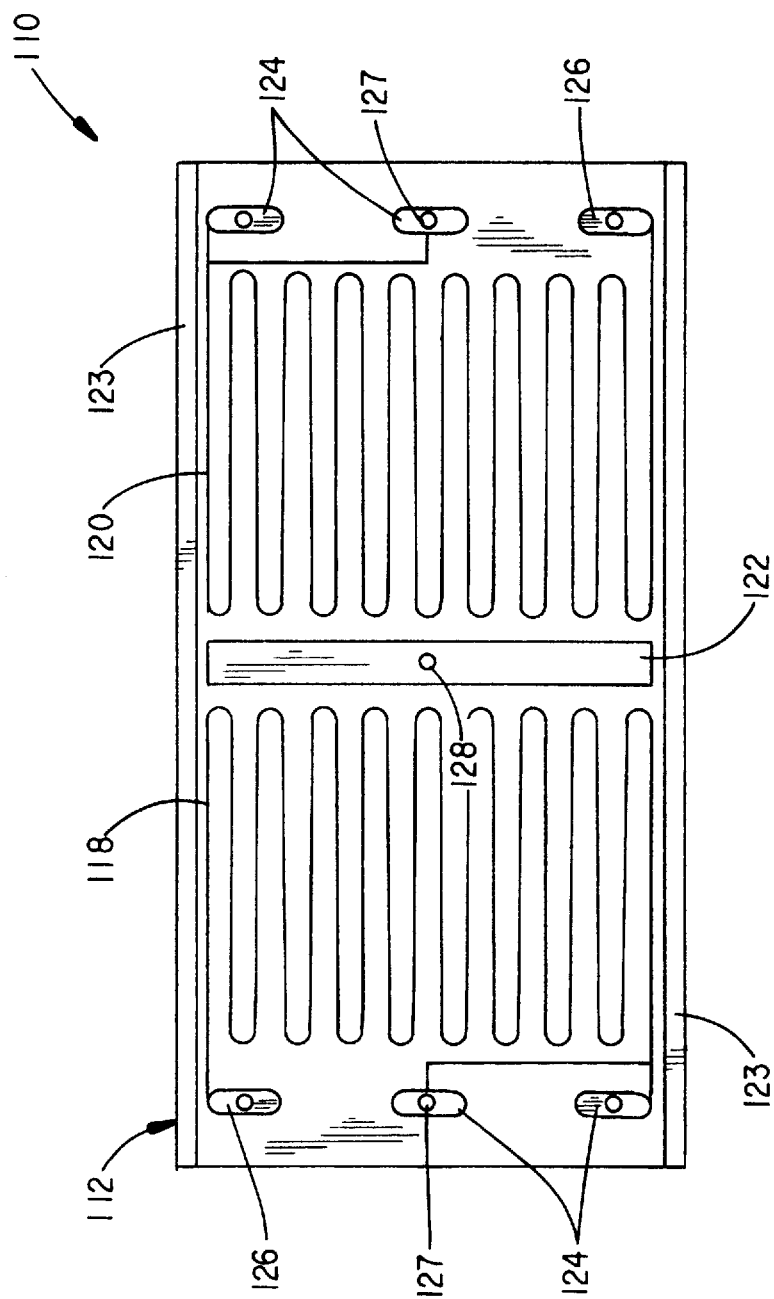
FIG. 7 is a top plan view of a signal layer containing mirrored signal paths and bordering ground conductors.
Figure 8:
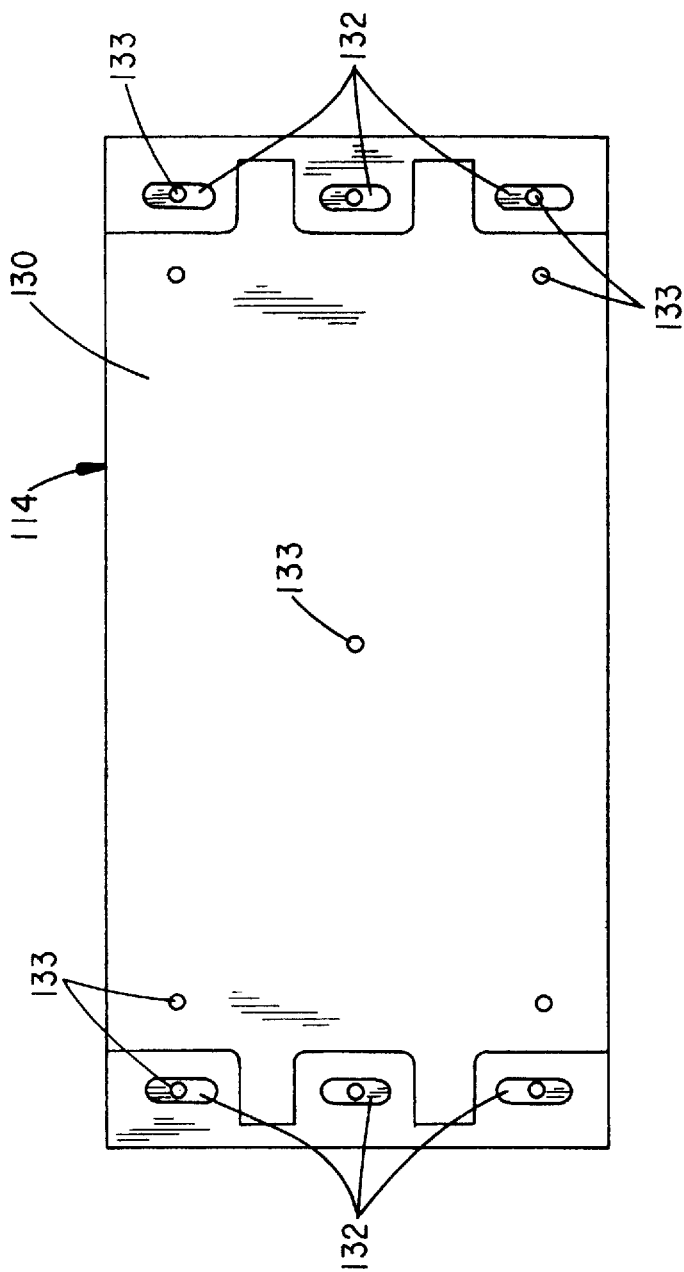
FIG. 8 is a top plan view of the ground layer which is used with the mirrored signal layer of FIG. 7.
Figure 9:
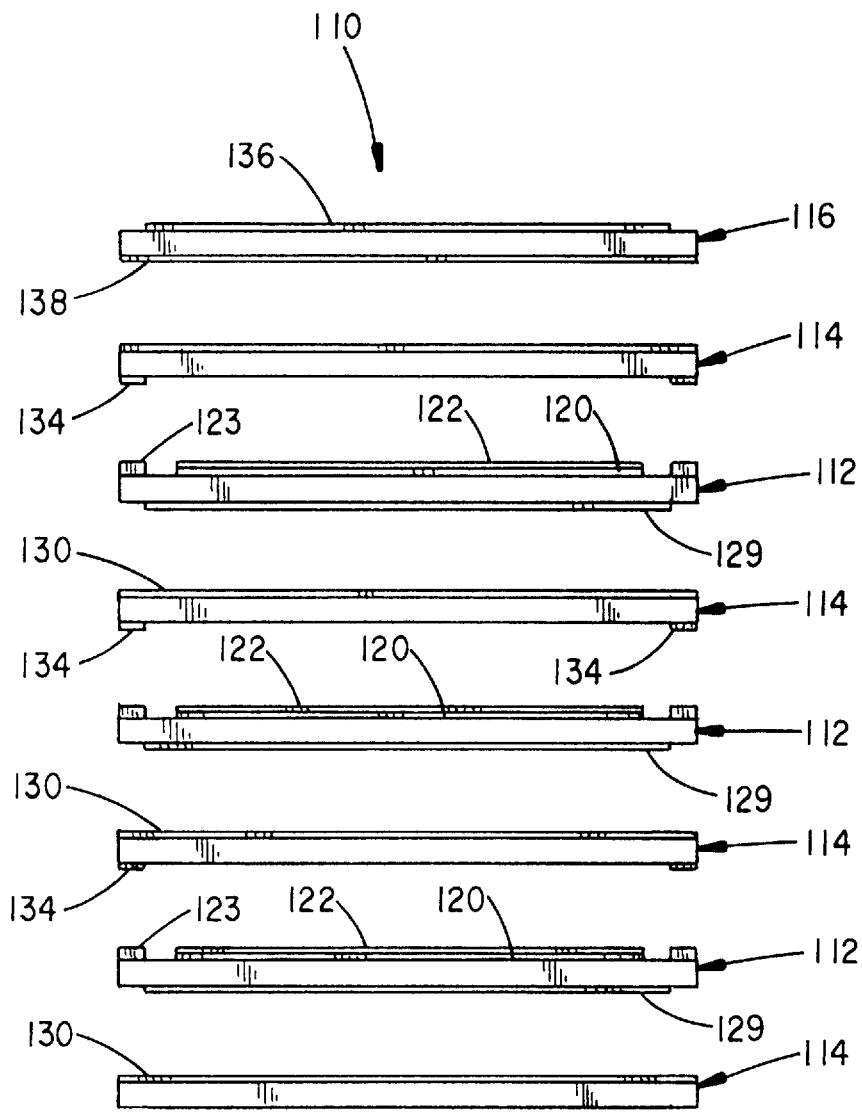
FIG. 9 is an exploded assembly drawing shown in edge profile to three exemplary levels of a multi-level, mirrored delay line assembly.

FIGS. 7 through 9 depict still another alternative construction of a delay line assembly 110. A number of mirrored signal layers 112, reference FIG. 7, are stacked between intervening ground layers 114, reference FIG. 8. The exemplary three level assembly 110 is shown exploded edge profile at FIG. 9 and wherein a termination layer 116 is also shown.

With attention to FIG. 7, the mirrored signal layer 112 provides a pair of identical serpentine conductors 118 and 120 which are arranged at adjacent halves of one surface of the layer 112. Ground strips 122 and 123 separate and bound the conductors 118, 120. Termination pads 124 and 126 are provided at the ends of the layer 112 to appropriately couple the signal layers 112 at the various levels of the assembly 110. Through vias 127 connect the pads 124, 126 to termination pads 124 and 128 at the opposite side of the substrate. Separate through vias 128 couple the ground strips 122 and 123 to a ground plane 129 at the opposite side of the substrate.

The ground layer 114, reference FIG. 8, provides a conductive plane 130 which substantially covers one surface. A number of isolated termination pads 132 and included through vias 133 couple to termination pads 132 at the opposite surface of the substrate to facilitate coupling between the termination pads 124, 126 and the signal paths at the various levels. Termination pads 134 are also provided to assure continuity between the ground planes 129, 130 and the ground strips 122 and 123.

The termination layer 116, reference FIG. 9, includes a conductive surface 136 that is appropriately patterned to provide appropriate device terminations 1–16. A ground layer 138 at the bottom surface contacts the ground plane 130 of a lower lying ground layer 112.

Figure 10:
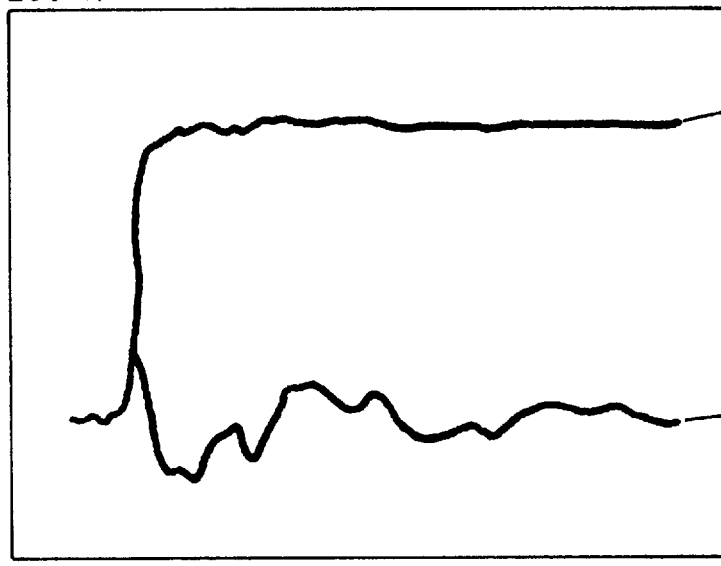
FIG. 10 is drawing of an oscilloscope tracing of the cross talk exhibited for a parallel path delay line assembly.

FIG. 10 depicts an oscilloscope tracing at 5 nsec/div and 200 mv/div of a rising edge of a square wave signal 140 that was transmitted over the conductors 36, 38 for the assembly 30. A resulting slight amount of cross talk 142 between the conductors 36, 38 is also shown. The essential lack of noise at the signal 140 demonstrates the desired common mode rejection capabilities of the device 30.

Figure 11:
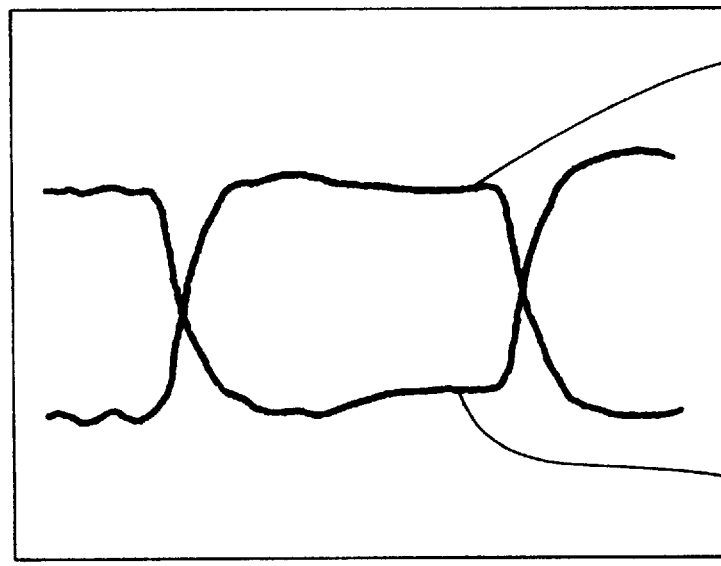
FIG. 11 is a drawing of an oscilloscope tracing of the skewing exhibited for a parallel path delay line assembly.

FIG. 11 depicts an oscilloscope tracing at 5 nsec/div and 200 mv/div for 1 MHz square wave signals 144, 146 that were transmitted over the conductors 36, 38 for the assembly 30. Essentially zero skewing occurred at the cross over point of the signals at the reference ground level.

Figure 12:
FIG. 12 is a drawing of an oscilloscope tracing of the cross talk exhibited for an over-under delay line assembly.
Figure 13:
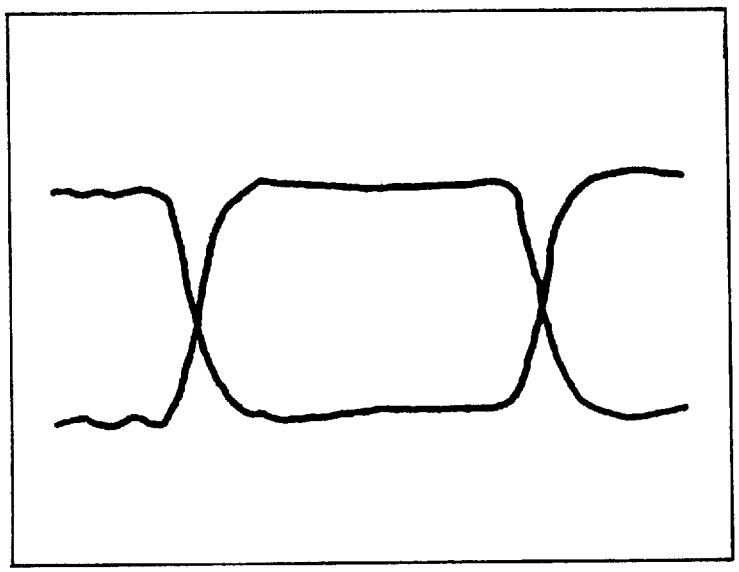
FIG. 13 is a drawing of an oscilloscope tracing of the skewing exhibited for an over-under delay line assembly.

FIGS. 12 and 13 respectively demonstrate oscilloscope tracings for comparable PECL signals transmitted over the conductors 86, 88 for the assembly 70 and which depict the resultant cross talk and skewing. Slightly more cross talk is apparent for the assembly 70, but again without any skewing. The performance of each assembly 30 and 70, however, is better than with existing delay lines.

While the invention has been described with respect to a number of presently preferred circuit components and assembly constructions, it is to be appreciated still other constructions may be suggested to those skilled in the art. The scope of the invention should therefore be construed broadly within the spirit and scope of the following claims.

What is claimed is:

1. Delay line apparatus comprising:
   a) a signal layer including first and second signal conductors having a plurality of serpentine windings deposited in displaced parallel registry to one another on one surface of a substrate, wherein the windings extend laterally at a reduced width in a pinched region between adjoining end regions, wherein first and second ground conductors are deposited in strips coextensive with said first and second signal conductors, a plurality of input and output terminals connected to said first and second signal conductors and to opposite surfaces of the substrate, first termination means deposited at a surface of the substrate opposite said pinched region of sand first and second signal conductors and connected to at least one of said first and second ground conductors, a dielectric resin deposited over said first and second signal conductors, and wherein each of said first and second signal conductors exhibit a constant impedance over its length;

b) first and second ground layers respectively mounted above and below said signal layer, wherein each of said first and second ground layers includes a dielectric substrate having a conductive ground plane substantially covering a first surface and including second termination means at a second surface opposite to said first surface and connected to said conductive ground plane, wherein the second termination means of one of said first and second ground layers lies in registry with and contacts said first and second ground conductors, wherein the ground plane of the other of said first and second ground layers contacts the first terminations means, and including third termination means exposed at at least one of the first and second surfaces and electrically isolated from said conductive ground plane and lying in registry and contact with said input and output terminals, whereby said first and second signal conductors are displaced from the ground planes by a single thickness of substrate; and c) means for coupling electrical signals to said third termination means and a reference ground signal to said first and second ground layers.

2. Apparatus as set forth in claim 1 wherein the width of each of said first and second signal conductors is equal to the displacement between said first and second signal conductors.

3. Apparatus as set forth in claim 1 including a plurality of layered sets of said signal layer and first and second ground layers, wherein each set of said signal and first and second ground layers includes fourth termination means for connecting the first and second signal conductors and first and second ground conductors of each set to the next adjacent layered set.

4. Apparatus as set forth in claim 3 wherein said first, second, third and fourth termination means comprise a plurality of contacts having through vias which are aligned to one another from one substrate to the next.

5. Apparatus as set forth in claim 1 wherein said signal layer comprises first and second signal conductors sputtered onto a ceramic substrate and including a plurality of electrically common input and output terminals mounted to opposite surfaces of the signal substrate and wherein each of said input and output terminals is coupled to said third termination means.

6. Delay line apparatus comprising:
a) a signal layer including first and second signal conductors deposited on opposite surfaces of a substrate, first and second ground conductors deposited in strips longitudinally adjacent each side of each of said first and second signal conductors, a plurality of input and output terminals at each surface connected to said first and second signal conductors, a dielectric resin deposited over said first and second signal conductors, and wherein each of said first and second signal conductors exhibits a constant impedance over its length;

b) first and second ground layers respectively mounted above and below said signal layer, wherein each of said first and second ground layers includes a substrate having a conductive ground plane substantially covering a first surface and including first termination means at a second surface opposite to said first surface connected to said conductive ground plane and lying in face to face registry and contact with one of said first and second ground conductors and second termination means at a second surface opposite to said first surface and electrically isolated from said conductive ground plane and lying in face to face registry and contact with said input and output terminals, and wherein said first and second ground layers are mounted such that the first and second signal conductors are displaced from the ground plane conductors of said first and second ground layers by a single thickness of substrate; and c) means for coupling electrical signals to said first and second signal conductors and a reference ground signal to said first and second ground layers.

7. Apparatus as set forth in claim 6 including a plurality of layered sets of said signal and first and second ground layers, wherein each set of said signal and first and second ground layers includes third termination means for connecting the first and second signal conductors between each adjacent layer set to one another and the conductive ground planes of each set to the next adjacent layered set.

8. Delay line apparatus comprising:
a) a signal layer including first and second serpentine signal conductors deposited at opposite ends of one surface of a substrate, first and second ground conductors deposited in strips coextensive with each of said first and second signal conductors, a third ground conductor deposited in a strip between said first and second signal conductors and transverse to said first and second ground conductors, a plurality of input and output terminals connected to said first and second signal conductors and to opposite surfaces of the substrate, first termination means deposited at a surface of the substrate opposite the first and second signal conductors and connected to said first, second and third ground conductors, a dielectric resin deposited over said first and second signal conductors, and wherein each of said first and second signal conductors exhibits a constant impedance over its length;

b) first and second ground layers respectively mounted above and below said signal layer, wherein each of said first and second ground layers includes a substrate having a conductive ground plane substantially covering a first surface and including second termination means at a second surface opposite to said first surface connected to said conductive ground plane, wherein the second termination means of one of said first and second ground layers lies in registry with and contacts said first, second and third ground conductors, wherein the ground plane of the other of said first and second ground layers contacts the first terminations means, and third termination means exposed at the first and second surfaces and electrically isolated from said conductive ground plane and lying in registry and contact with said input and output terminals, whereby said first and second signal conductors are displaced from the ground planes by a single thickness of substrate; and c) means for coupling electrical signals to said first and second signal conductors and a reference ground signal to said first and second ground layers.

9. Apparatus as set forth in claim 8 including a plurality of layered sets of said signal layer and first and second ground layers, wherein each set of said signal and first and second ground layers includes fourth termination means for connecting the first and second signal conductors and ground conductors of each set to the next adjacent layered set.

10. Delay line apparatus comprising:

a) a signal layer including first and second signal conductors having a plurality of serpentine windings deposited in displaced parallel registry to one another on one surface of a substrate, wherein the windings extend laterally at a reduced width in a pinched region between adjoining end regions, wherein first and second ground conductors are deposited in strips coextensive with the pinched region of said first and second signal conductors, a plurality of input and output terminals connected to said first and second signal conductors and to opposite surfaces of the substrate, first termination means deposited at a surface of the substrate opposite said pinched region of said first and second signal conductors and connected to said first and second ground conductors, a dielectric resin deposited over said first and second signal conductors and wherein each of said first and second signal conductors exhibit a constant impedance over its length;

b) first and second ground layers respectively mounted above and below said signal layer, wherein each of said first and second ground layers includes a dielectric substrate having a conductive ground plane substantially covering a first surface and including second termination means at a second surface opposite to said first surface connected to said conductive ground plane, wherein the second termination means of one of said first and second ground layers lies in registry with and contacts said first and second ground conductors, wherein the ground plane of the other of said first and second ground layers contacts the first terminations means, and including third termination means exposed at at least one of the first and second surfaces and electrically isolated from said conductive ground plane and lying in registry and contact with said input and output terminals, whereby said first and second signal conductors are displaced from the ground planes by a single thickness of substrate; and c) means for coupling electrical signals to said third termination means and a reference ground signal to said first and second ground layers.

11. Apparatus as set forth in claim 10 including a plurality of layered sets of said signal layer and first and second ground layers, wherein each set of said signal and first and second ground layers includes fourth termination means for connecting the first and second signal conductors and first and second ground conductors of each set to the next adjacent layered set.

12. Apparatus as set forth in claim 11 wherein the bottom most layer set comprises a signal layer and a ground layer having a ground plane lying in registry and contact with the first termination means of the signal layer thereof.

13. Apparatus as set forth in claim 3 wherein the bottom most layer set comprises a signal layer and a ground layer having a ground plane lying in registry and contact with the first termination means of the signal layer thereof.

14. Apparatus as set forth in claim 9 wherein the bottom most layer set comprises a signal layer and a ground layer having a ground plane lying in registry and contact with the first termination means of the signal layer thereof.

* * * * *